United States Patent
Su

(10) Patent No.: US 8,214,312 B2
(45) Date of Patent: Jul. 3, 2012

(54) SYSTEM AND METHOD FOR CALIBRATING RADIO FREQUENCY POWER OF COMMUNICATION DEVICES

(75) Inventor: Yi-Jen Su, Taipei (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 521 days.

(21) Appl. No.: 12/509,141

(22) Filed: Jul. 24, 2009

(65) Prior Publication Data

US 2010/0169254 A1  Jul. 1, 2010

(30) Foreign Application Priority Data

Dec. 29, 2008  (CN) .......................... 2008 1 0306611

(51) Int. Cl.
  G05B 13/02 (2006.01)
  G06E 1/00 (2006.01)
  G06E 3/00 (2006.01)
  G06F 15/18 (2006.01)
  G06G 7/00 (2006.01)
  G01D 18/00 (2006.01)
  G01D 21/00 (2006.01)
  G01P 21/00 (2006.01)
  G01R 35/00 (2006.01)

(52) U.S. Cl. ....................................................... 706/23
(58) Field of Classification Search ........................ None
See application file for complete search history.

(56) References Cited

U.S. PATENT DOCUMENTS

| 6,734,731 B2 * | 5/2004 | Cavers et al. ................. 330/149 |
| 2007/0075770 A1 * | 4/2007 | Long ............................. 330/149 |

FOREIGN PATENT DOCUMENTS

EP  2293435 A1 *  3/2011

OTHER PUBLICATIONS

Naskas, N. et al.; "Neural-Network-Based Adaptive Baseband Predistortion Method for RF Power Amplifiers"; 2004; IEEE; Transactions on Circuits and Systems-II: Express Briefs, vol. 51, No. 11; pp. 619-623.*
Isaksson, Magnus et al.; "Nonlinear Behavioral Modeling of Power Amplifiers Using Radial-Basis Function Neural Networks"; 2005; IEEE; Microwave Symposium Digerst; pp. 1967-1970.*
Pedro, Jose C. et al.; "A Comparative Overview of Microwave and Wireless Power-Amplified Behavioral Modeling Approaches"; IEEE; Transactions on Microwave Theory and Techniques, vol. 53, No. 4; pp. 1150-1163.*
Isaksson, Magnus et al.; "A Comparative Analysis of Behavioral Models for RF Power Amplifiers"; 2006; IEEE; Transactions on Microwave Theory and Techniques, vol. 54, No. 1; pp. 348-359.*

* cited by examiner

*Primary Examiner* — Alan Chen
*Assistant Examiner* — Stanley K Hill
(74) *Attorney, Agent, or Firm* — Altis Law Group, Inc.

(57) ABSTRACT

A radio frequency (RF) calibrating system and a method for calibrating RF power of communication devices are provided. The method collects RF signals transmitted from the communication devices, and generates a group of training samples by retrieving measurement data from the RF signals. The method further constructs a neural network according to the group of training samples, calibrate RF power of the communication devices using the neural network, and generate corresponding calibration results of the RF power. In addition, the method generates a frequency spectrum of the RF power according to the calibration results of the RF power, and displays the frequency spectrum on a display device of the RF calibrating system.

18 Claims, 9 Drawing Sheets

SYSTEM AND METHOD FOR CALIBRATING RADIO FREQUENCY POWER OF COMMUNICATION DEVICES

BACKGROUND

1. Technical Field

Embodiments of the present disclosure relate to systems and methods for testing communication devices, and more particularly to a system and method for calibrating radio frequency (RF) power of communication devices.

2. Description of Related Art

Communication systems are known to support wireless and/or wired communications between wireless and/or wired communication devices. Generally, each type of communication system may operate in accordance with one or more communication standards, such as global system for mobile communications (GSM), code division multiple access (CDMA), radio frequency identification (RFID), and general packet radio service (GPRS), and/or variations thereof.

As the trend for communication devices to support multiple standards continues, the trends include the desire to integrate radio frequency (RF) portions (i.e., one or more RF amplifiers) to a single chip of a communication device. A digital-to-analog converter (DAC) that is coupled to the RF amplifier of the communication device, and may be used to convert digital signals to an analog signals transmitted from the RF amplifier. In many instances, it is difficult to adjust power of the RF amplifier of the communication devices.

Therefore, there is a system and method for calibrating RF power of communication devices, which can adjust the relationship between the power of DAC and the power of the RF amplifier the communication devices.

DETAILED DESCRIPTION

Figure 1:
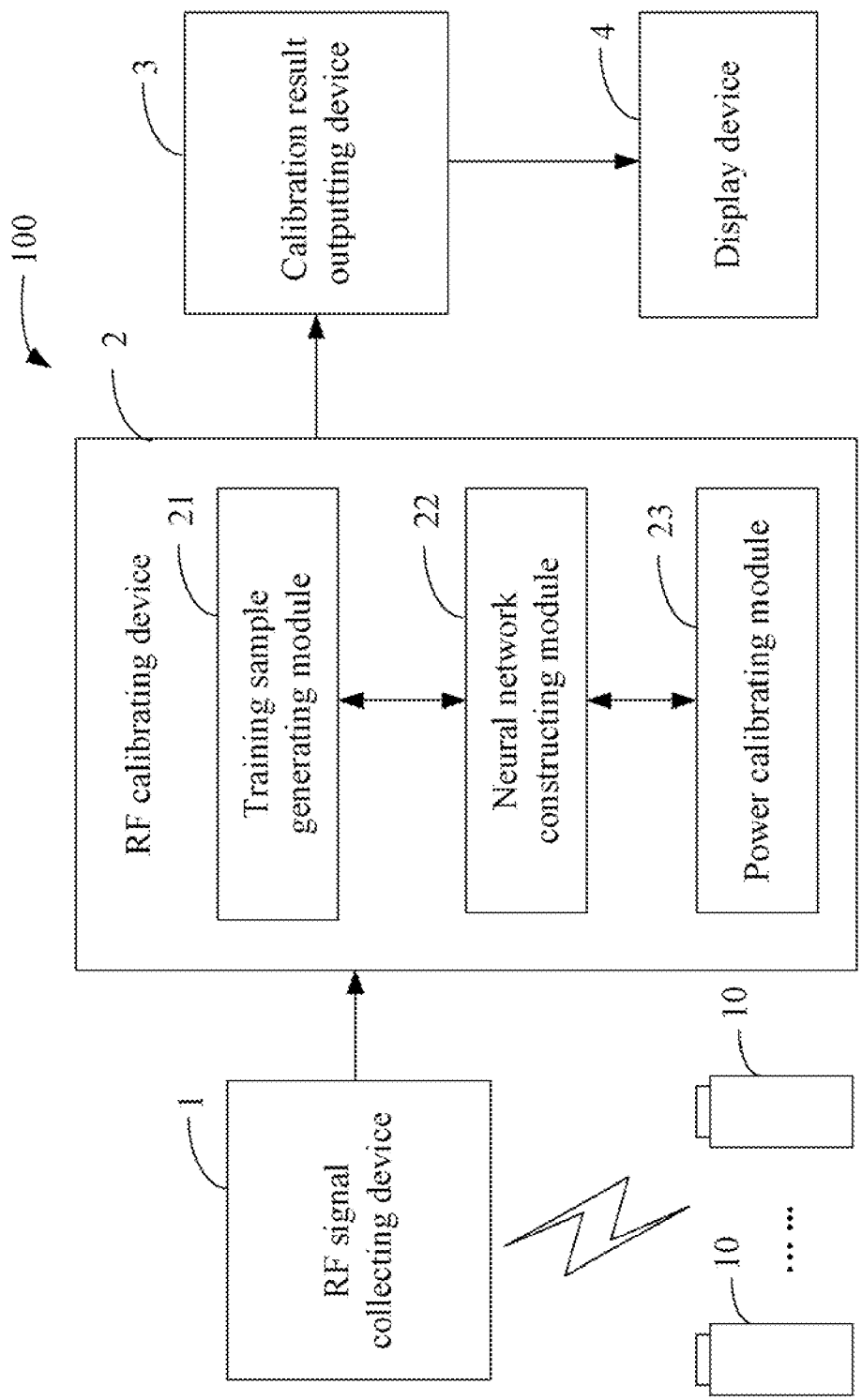
FIG. 1 is a schematic diagram of one embodiment of a RF calibrating system for calibrating RF power of communication devices.

FIG. 1 is a schematic diagram of one embodiment of a radio frequency (hereinafter referred to as "RF") calibrating system 100. The RF calibrating system 100 may be used to calibrate RF power of a plurality of communication devices 10, such as N number of mobile phones, for example. The RF calibrating system 100 is included in and implemented by a computing system, and may include an RF signal collecting device 1, an RF calibrating device 2, and a calibration result outputting device 3.

The RF signal collecting device 1 is operable to collect RF signals transmitted from the plurality of communication devices 10, and transmit the RF signals to the RF calibrating device 2. The RF signal collecting device 1 may be hardware embedded with software modules that can collect signals from the communication devices 10.

The RF calibrating device 2 is operable to calibrate RF power of the communication devices 10 by using a neural network (refer to FIG. 2) as described below. In one embodiment, the RF calibrating device 2 may include a training sample generating module 21, a neural network constructing module 22, and a power calibrating module 23. In general, the word "module," as used herein, refers to logic embodied in hardware or firmware, or to a collection of software instructions, written in a programming language, such as, for example, Java, C, or assembly. One or more software instructions in the modules may be embedded in a storage device, such as an EPROM. The modules described herein may be implemented as either software and/or hardware modules and may be stored in any type of computer-readable medium or other storage device.

The training sample generating module 21 is operable to receive the RF signals from the RF signal collecting device 1, and obtain a plurality of measurement data from the RF signals to generate N groups of training samples. In one embodiment, each of the training samples is sourced from the measurement data that are denoted as $\{(DAC_1,P_1),(DAC_2,P_2),\Lambda,(DAC_M,P_M)\}$, where "DAC" represents a digital-to-analog converter power of each of the communication devices 10, "P" represents the RF power of each of the communication devices 10, and "M" represents a total number of the measurement data.

Figure 2:
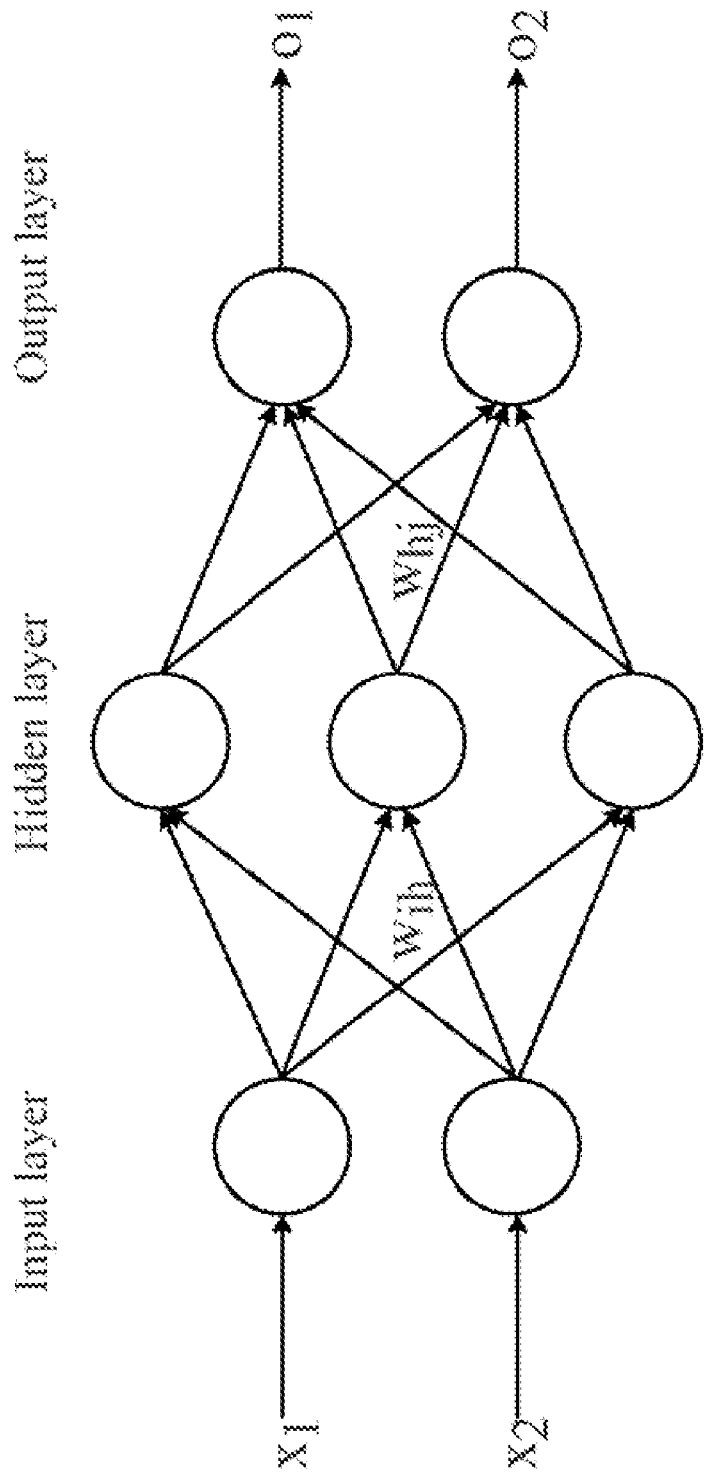
FIG. 2 is a schematic diagram illustrating a neural network model.
Figure 3:
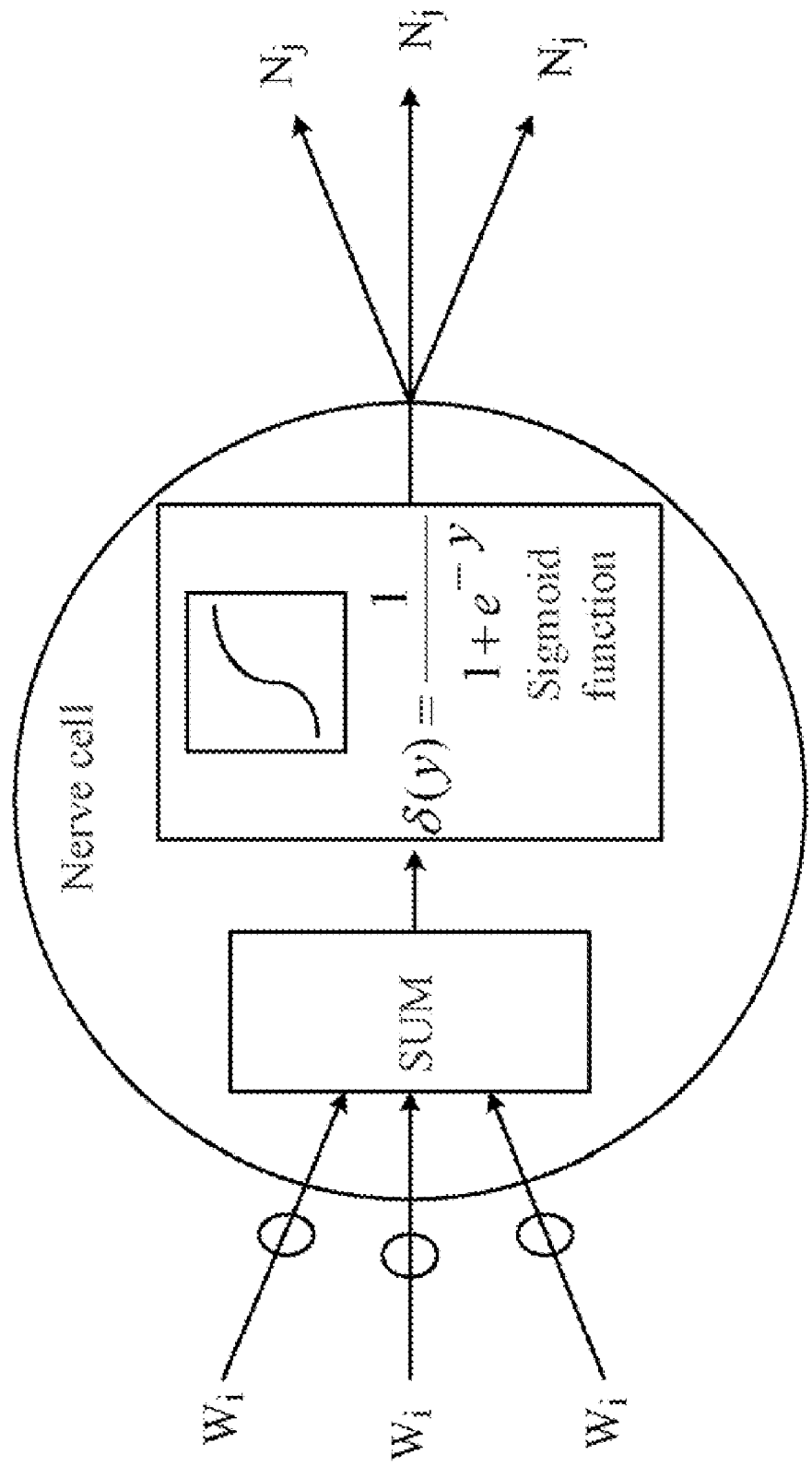
FIG. 3 is a schematic diagram illustrating an internal structure of one nerve cell of the neural network.

The neural network constructing module 22 is operable to generate a plurality of nerve cells of a neural network to be constructed, calculate a weight value of each of the nerve cells according to the N training samples, and construct the neural network according to the nerve cells with corresponding weight values. In one embodiment, the neural network is an information processing system that is composed of a large number of highly interconnected information processing nodes (i.e., nerve cells) for calibrating the RF power of the communication devices 10. Referring to FIG. 2, the neural network includes an input layer, a hidden layer, and an output layer. Each of the layers may include a plurality of nerve cells, where each nerve cell of each layer is connected to a nerve cell of the next layer. Referring to FIG. 3, each of the nerve cells calibrates the RF signals input from the input layer of the neural network, so as to generate calibrated RF power of the one or more RF signals.

The power calibrating module 23 is operable to calibrate the RF power of the communication devices 10 using the neural network, and generate calibration results of the RF power of the communication devices 10.

Figure 8:
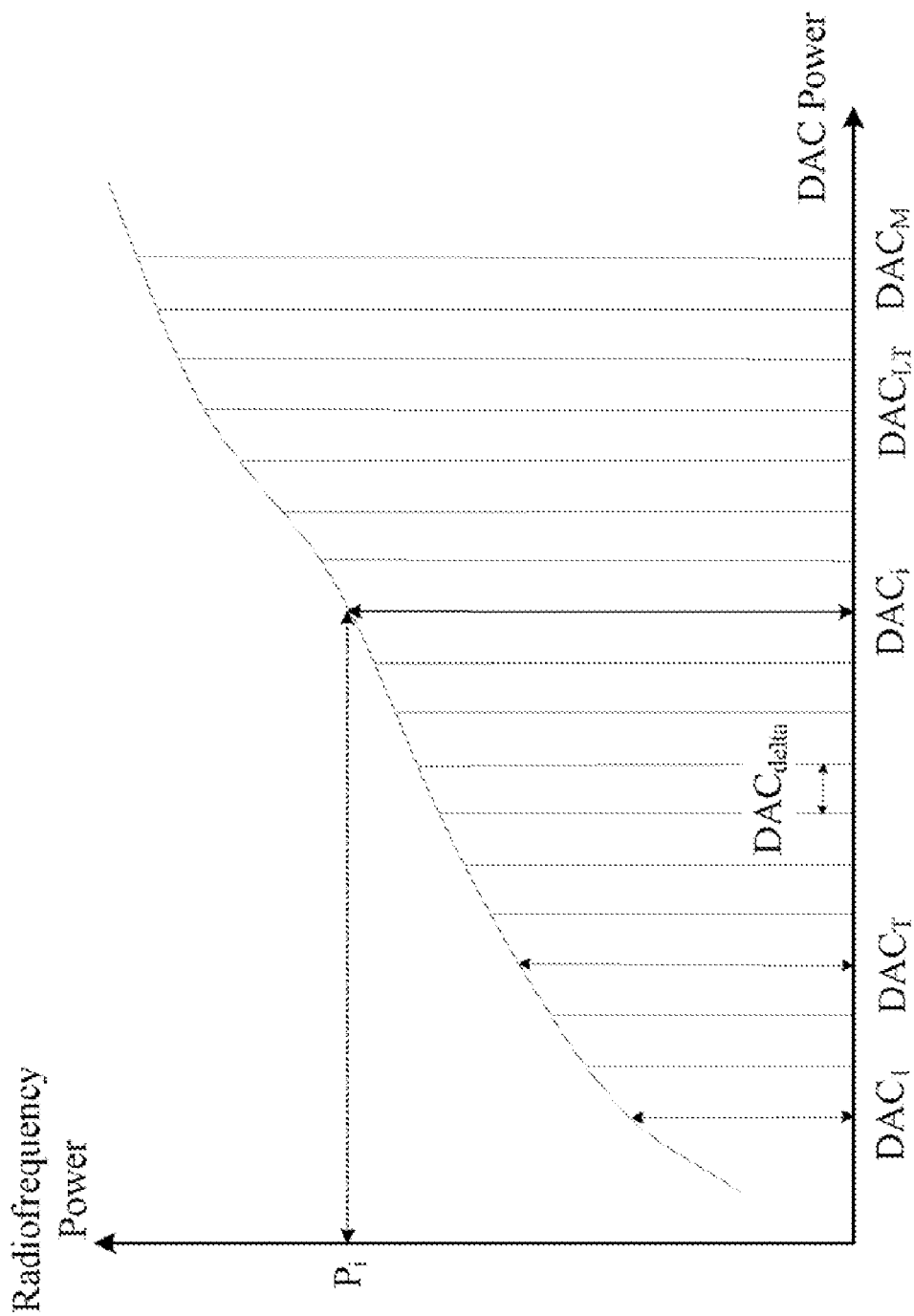
FIG. 8 is a schematic diagram illustrating a frequency spectrum of the actual RF power of the communication devices.

The calibration result outputting device 3 is operable to generate a frequency spectrum of the RF power according to the calibration results, and output the frequency spectrum to a display device 4 of the computing system 100. The calibration results outputting device 3 may be hardware embedded with software modules that can output and display the frequency spectrum on the display device 4. Referring to FIG. 8, the frequency spectrum is a curve diagram that represents a relationship between the RF power and digital-to-analog converter (hereinafter referred to as "DAC") power.

FIG. 2 is a schematic diagram illustrating a neural network model. In one embodiment, the neural network may be a kind of feed-forward back propagation neural network. As shown in FIG. 2, the neural network includes an input layer, a hidden layer, and an output layer. Each of the layers may include a plurality of nerve cells, and each nerve cell of each layer is connected to a nerve cell of the next layer. En one embodiment, the RF signals may be input from the input layer, and the RF power may be calibrated by transmitting the RF signals through the hidden layer of the neural network. After the calibrated RF power have been generated, the calibration results outputting device 3 outputs the calibrated RF power via the output layer of the neural network.

FIG. 3 is a schematic diagram illustrating an internal structure of one nerve cell of the neural network. In one embodiment, the nerve cell receives one or more RF signals, each of which is multiplied by a weight value (denoted as "$W_i$"), from the previous layer. The nerve cell adds all the RF signal values to calculate a sum value, and then converts the sum value to a calibrated value by performing a sigmoid function $\delta(y)$. The sigmoid function $\delta(y)$ is described as follows:

$$\delta(y) = \frac{1}{1 + e^{-y}},$$

where "y" is the RF signal received from the RF signal collecting device 1, and "e" is a conversion coefficient, such as "0.1", for example. The nerve cell generates the calibrated RF power (denoted as "$N_j$") according to the calibrated values of the one or more RF signals.

Figure 4:
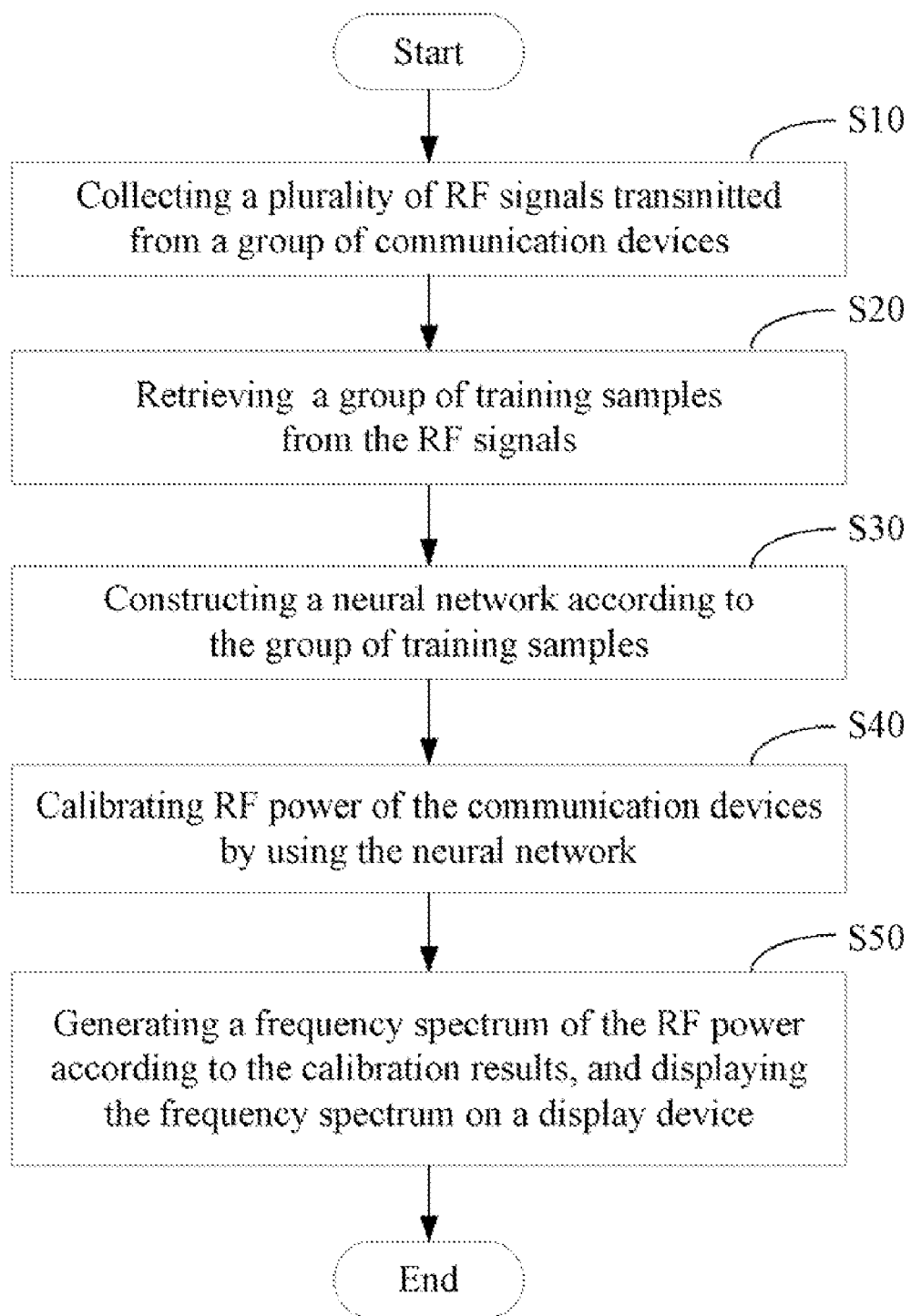
FIG. 4 is a flowchart of one embodiment of a method for calibrating RF power of communication devices by using the RF calibrating system of FIG. 1.

FIG. 4 is a flowchart of one embodiment of a method for calibrating RF power of communication devices 10 by using the RF calibrating system 100 of FIG. 1 as described above. Depending on the embodiment, additional blocks may be added, others removed, and the ordering of the blocks may be changed.

In block S10, the RF signal collecting device 1 collects a plurality of RF signals transmitted from a group of communication devices 10, and transmits the RF signals to the RF calibrating device 2.

In block S20, the training sample generating module 21 receives the RF signals from the RF signal collecting device 1, and obtains a plurality of measurement data from the RF signals to generate a group of training samples, such as N training samples. Details of generating the N groups of training samples are described as FIG. 5 below.

In block S30, the neural network constructing module 22 constructs a neural network according to the group of training samples. Details of constructing the neural network are described as FIG. 6 below.

In block S40, the power calibrating module 23 calibrates RF power of the communication devices 10 by using the neural network, and generates calibration results of the RF power. Details of calibrating RF power using the neural network are described as FIG. 7 below.

In block S50, the calibration result outputting device 3 generates a frequency spectrum of the RF power according to the calibration results, and displays the frequency spectrum on the display device 4. Referring to FIG. 8, the frequency spectrum is a curve diagram that represents a relationship between the RF power and DAC power.

Figure 5:
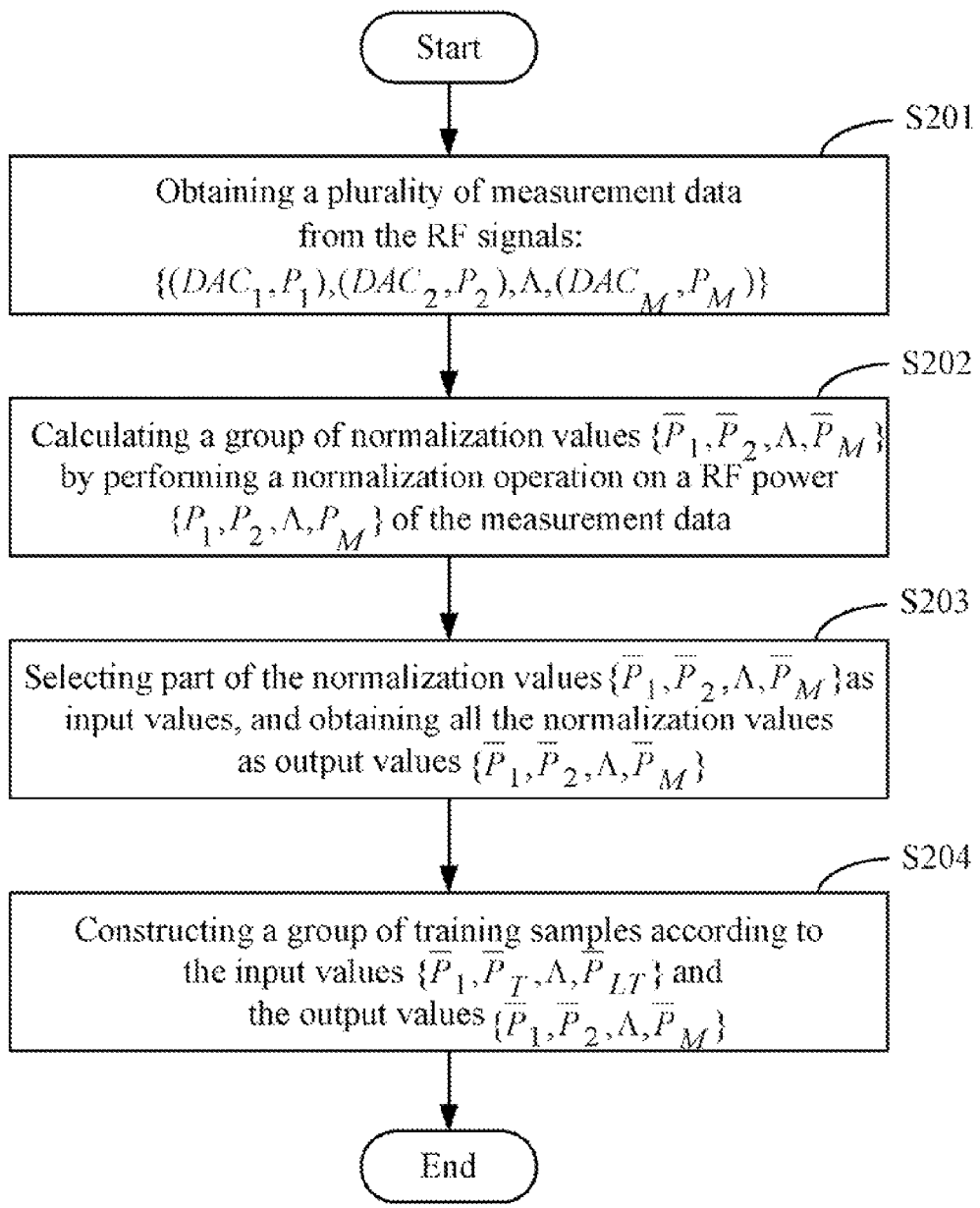
FIG. 5 is a flowchart of detailed descriptions of S20 in FIG. 4.

FIG. 5 is a flowchart of detailed descriptions of S20 in FIG. 4. In block S201, the training sample generating module 21 obtains a plurality of measurement data from the RF signals that are denoted as $\{(DAC_1,P_1),(DAC_2,P_2),\Lambda,(DAC_M,P_M)\}$, where "P" represents an actual RF power of each of the communication devices 10, and "M" represents a total number of the measurement data.

In block S202, the power calibrating module 23 calculates a group of normalization values (denoted as $\{\overline{P}_1,\overline{P}_2,\Lambda,\overline{P}_M\}$) by performing a normalization operation on each of the actual RF power $\{P_1,P_2,\Lambda,P_M\}$. The normalization operation is a operation function that can be denoted as $\overline{P}_i=(P_i-P_{min})/(P_{max}-P_{min})$, where "$\overline{P}_i$" is a normalization value of an actual RF power, "$P_i$" is an actual RF power value, "$P_{max}$" is a maximum value of the RF power, and "$P_{min}$" is a minimum value of the RF power.

In block S203, the training sample generating module 21 selects part of the normalization values $\{\overline{P}_1,\overline{P}_2,\Lambda,\overline{P}_M\}$ as input values that are denoted as $\{\overline{P}_1,\overline{P}_T,\Lambda,\overline{P}_{LT}\}_j$, where "T" represents a time interval of one selection process, and "L" represents the number of the selected measurement data. In one embodiment, "L" is less "M", and the product of "L" and "T" is less than "M". The training sample generating module 21 further selects all the normalization values $\{\overline{P}_1,\overline{P}_2,\Lambda,\overline{P}_M\}$ as output values.

In block S204, the training sample generating module 21 generates a group of training samples according to the input values $\{\overline{P}_1,\overline{P}T,\Lambda,\overline{P}_{LT}\}$ and the output values $\{\overline{P}_1,\overline{P}_2,\Lambda,\overline{P}_M\}$. In one embodiment, the RF signal collecting device 1 collects the RF $\{\overline{P}_1,\overline{P}_2,\Lambda,\overline{P}_M\}$. In one embodiment, the RF signal collecting device 1 collects the RF signals transmitted from N communication devices 10, thus N training samples need to be generated by the training sample generating module 21.

Figure 6:
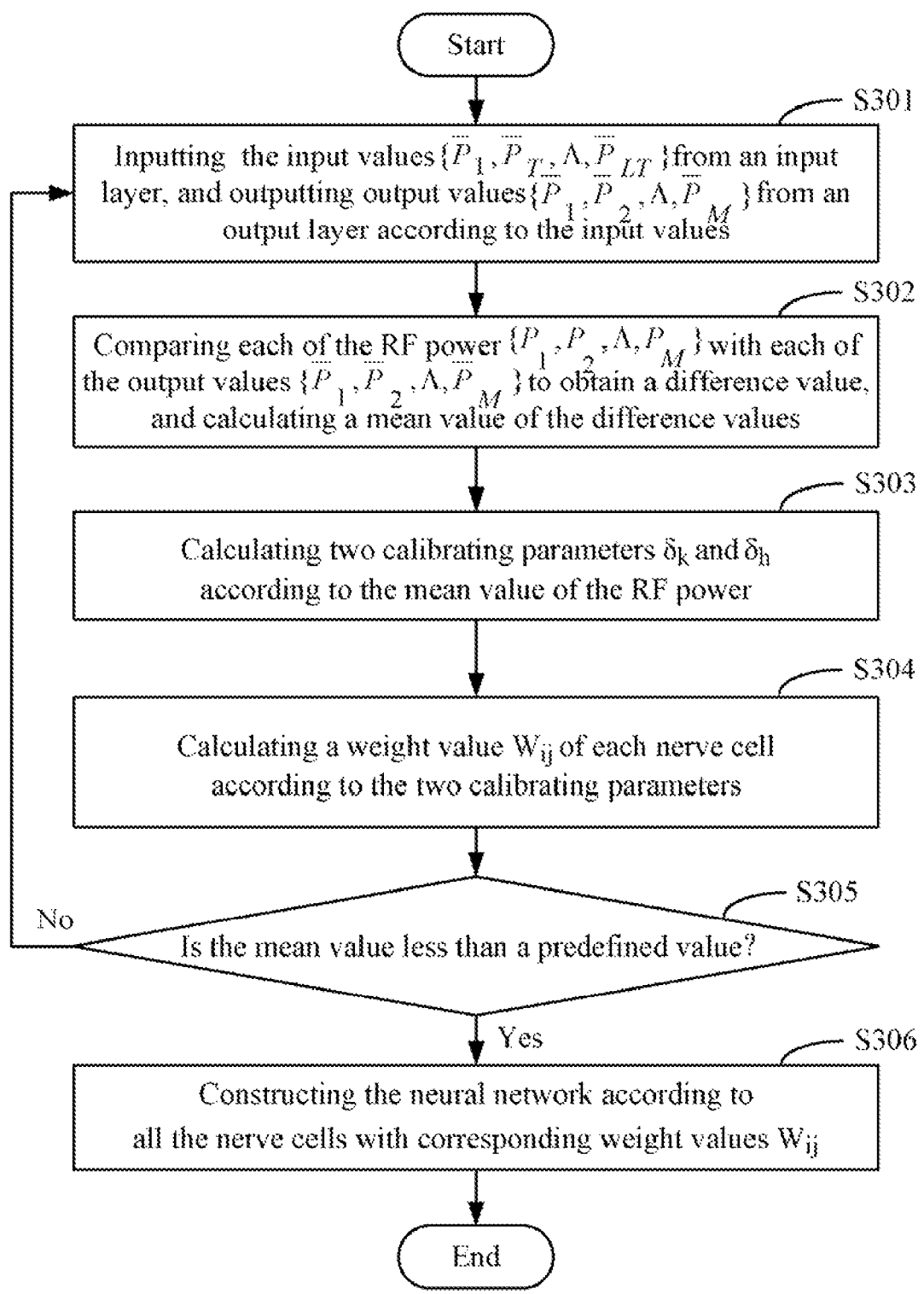
FIG. 6 is a flowchart of detailed descriptions of S30 in FIG. 4.

FIG. 6 is a flowchart of detailed descriptions of S30 in FIG. 4. In block S301, the neural network constructing module 22 inputs the input values $\{\overline{P}_1,\overline{P}_T,\Lambda,\overline{P}_{LT}\}$ of the training samples from the input layer of a neural network to be constructed, and calculates the output values $\{\overline{P}_1,\overline{P}_2,\Lambda,\overline{P}_M\}$ from the output layer according to the input values.

In block S302, the neural network constructing module 22 compares each of the actual RF power $\{P_1,P_2,\kappa,P_M\}$ with each of the output values $\{\overline{P}_1,\overline{P}_2,\kappa,\overline{P}_M\}$ to obtain a difference value, and calculates a mean value of the each RF power according the difference values.

In block S303, the neural network constructing module 22 calculates a first calibrating parameter "$\delta_k$" and a second calibrating parameter "$\delta_h$" according to the mean value of the RF power. The first calibrating parameter "$\delta_k$" is calculated by a first formula denoted as $\delta_k=o_k(1-o_k)(t_k-o_k)$, wherein "$o_k$" represents a actual value output from the output layer, and "$t_k$" represents a target value output from the output layer. The second "$\delta_h$" is calculated by a second formula denoted as $\delta_h=o_h(1-o_h)\Sigma w_{k_h}t_h$, where "$o_h$" represents a actual value output from the hidden layer, and "$t_h$" represents a target value output from the hidden layer.

In block S304, the neural network constructing module 22 calculates a weight value (denoted as "$W_{ij}$") of each nerve cell according the two calibrating parameters "$\delta_k$" and "$\delta_h$". In one embodiment, the weight value "$W_{ij}$" is calculated by performing the formula: $W_{ij}=Wj+\Delta W_{ij}$, wherein $\Delta W_{ij}=\eta \delta_j x_{ij}$, and "$\eta$" represents a calibrating coefficient, such as "0.5", for example.

In block S305, the neural network constructing module 22 determines whether the mean value is less than a predefined value, such as "1", for example. If the mean value is not less than a predefined value, the procedure returns to block S301 as described above. Otherwise, if the mean value is less than a predefined value, in block S306, the neural network constructing module 22 constructs the neural network according to all the nerve cells with corresponding weight values "$W_{ij}$".

Figure 7:
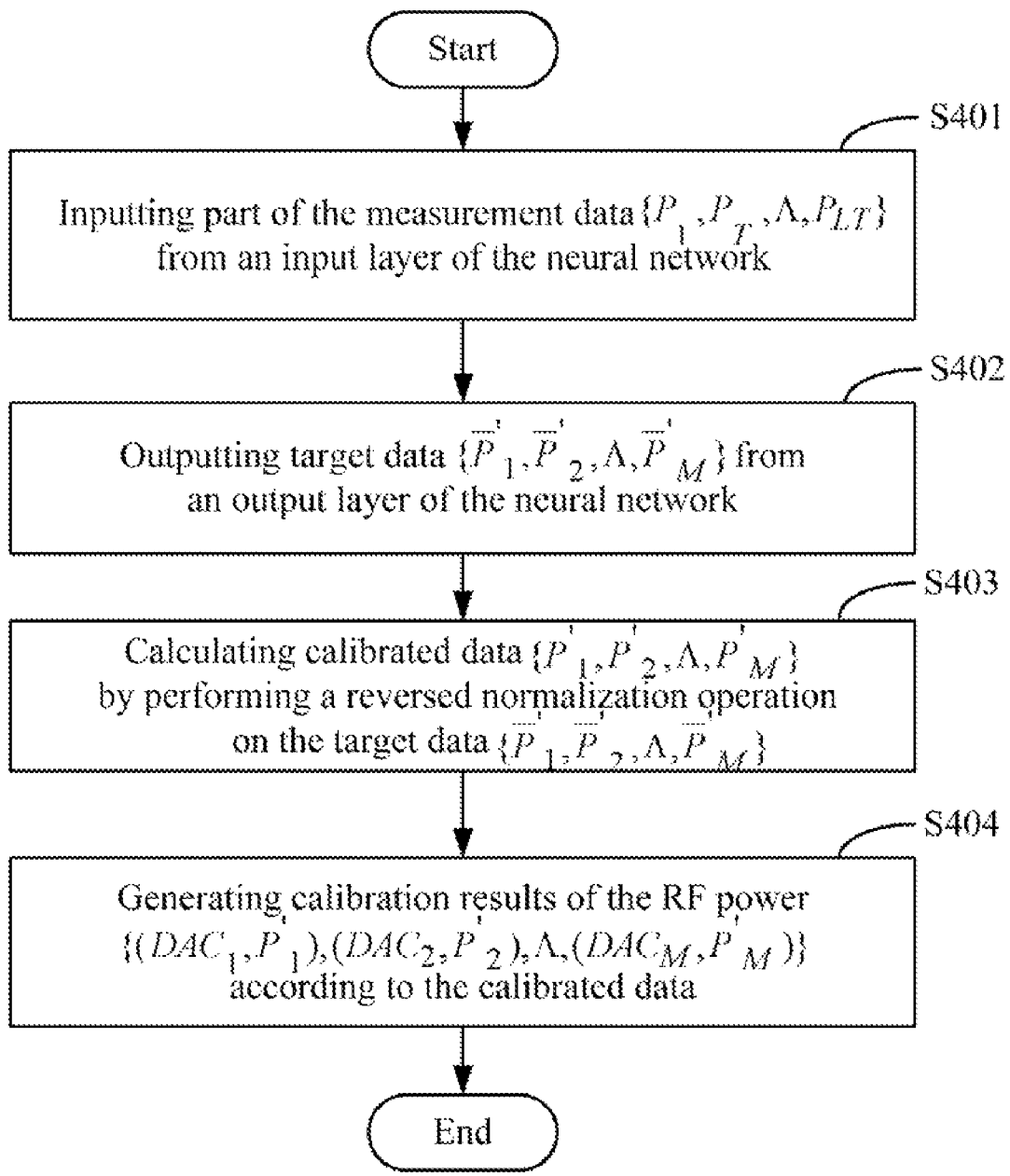
FIG. 7 is a flowchart of detailed descriptions of S40 in FIG. 4.

FIG. 7 is a flowchart of detailed descriptions of S40 in FIG. 4. In block S401, the power calibrating module 23 inputs part of the measurement data $\{P_1, P_T, \Lambda, P_{LT}\}$ from the input layer of the neural network constructed by the neural network constructing module 22. In block S402, the power calibrating module 23 outputs target data $\{\overline{P}'_1, \overline{P}'_2, \Lambda, \overline{P}'_M\}$ from the output layer of the neural network after the part of measurement data $\{P_1, P_T, \Lambda, P_{LT}\}$ are transmitted through the hidden layer of the neural network.

In block S403, the power calibrating module 23 obtains calibrated data $\{P'_1, P'_2, \Lambda, P'_M\}$ by performing a reversed normalization operation on the target data $\{\overline{P}'_1, \overline{P}'_2, \Lambda, \overline{P}'_M\}$. In block S404, the power calibrating module 23 generates the calibration results of the RF power denoted as $\{(DAC_1, P'_1), (DAC_2, P'_2), \Lambda, (DAC_M, P'_M)\}$ according to the calibrated data.

Figure 9:
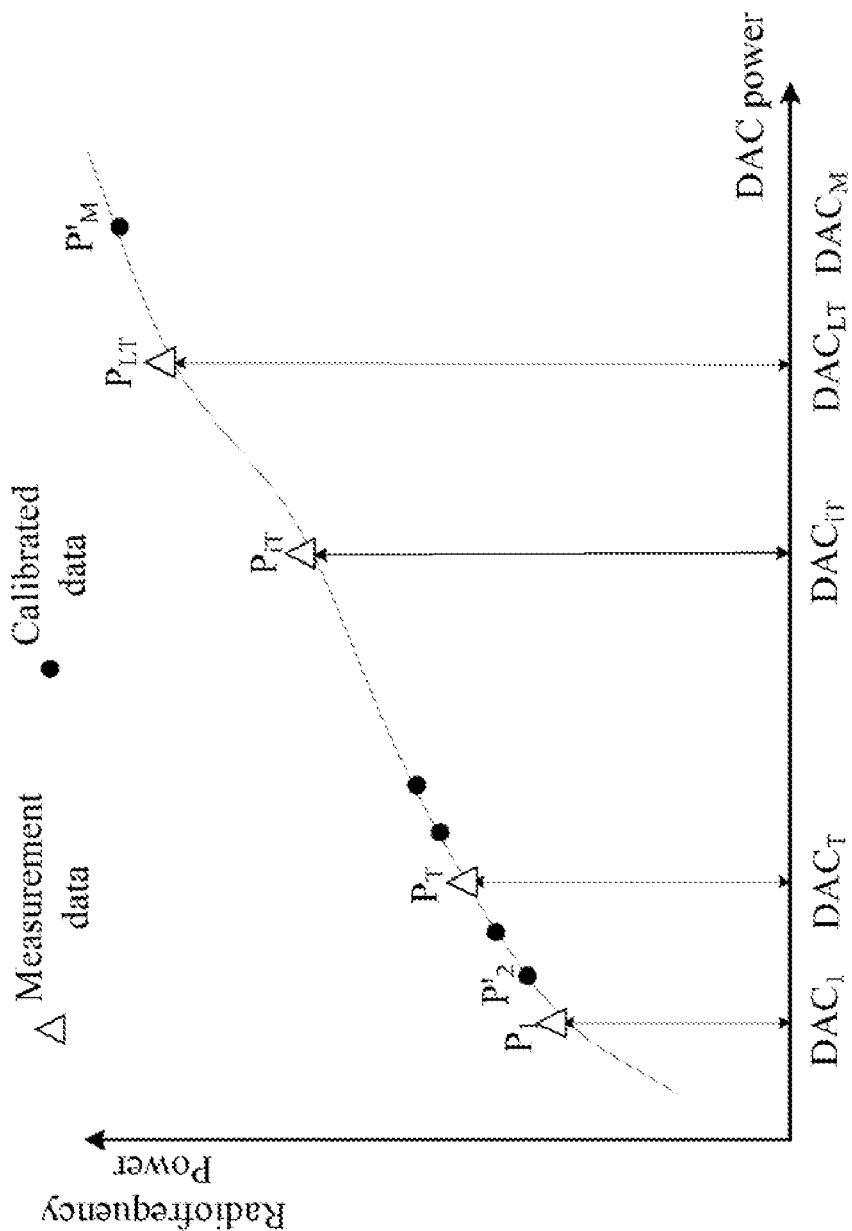
FIG. 9 is a schematic diagram illustrating a frequency spectrum of the calibrated RF power of the communication devices.

FIG. 8 is a schematic diagram illustrating a frequency spectrum of the actual RF power of the communication devices 10. When the RF calibrating device 2 calibrates the actual RF power, the calibration result outputting device 3 outputs a frequency spectrum according to the calibrated RF power $\{(DAC_1, P'_1), (DAC_2, P'_2), \Lambda, (DAC_M, P'_M)\}$ as shown in FIG. 9. Referring to FIG. 9, which is a schematic diagram illustrating a frequency spectrum of the calibrated RF power of the communication devices 10.

All of the processes described above may be embodied in, and fully automated via, functional code modules executed by one or more general purpose processors of a computing device. The functional code modules may be stored in any type of readable medium or other storage devices. Some or all of the methods may alternatively be embodied in specialized the computing device.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing system for calibrating radio frequency (RF) power of communication devices, the computing system comprising:
   an RF signal collecting device operable to collect RF signals transmitted from a plurality of communication devices;
   an RF calibrating device, comprising:
      a training sample generating module operable to receive the RF signals from the RF signal collecting device, and obtain a plurality of measurement data from the RF signals to generate a group of training samples;
      a neural network constructing module operable to construct a neural network according to the group of training samples;
      a power calibrating module operable to calibrate RF power of the communication devices using the neural network, and generate calibration results of the RF power; and
      a calibration result outputting device operable to generate a frequency spectrum of the RF power according to the calibration results, and display the frequency spectrum on a display device.

2. The computing system according to claim 1, wherein the neural network constructing module is further operable to generate a plurality of nerve cells of the neural network, calculate a weight value of each of the nerve cells according to the group of training samples, and construct the neural network based upon the nerve cells with corresponding weight values.

3. The computing system according to claim 1, wherein the neural network comprises an input layer, a hidden layer, and an output layer.

4. The computing system according to claim 3, wherein the power calibrating module calibrates the RF power by transmitting the RF signals through the hidden layer of the neural network.

5. The computing system according to claim 3, wherein the power calibrating module outputs the calibration results of the RF power via the output layer of the neural network.

6. The computing system according to claim 1, wherein the frequency spectrum is a curve diagram that represents a relationship between digital-to-analog converter (DAC) power and the RF power.

7. A computer-enabled method for calibrating radio frequency (RF) power of communication devices, the method comprising:
   (a) collecting a plurality of RF signals transmitted from a plurality of communication devices;
   (b) generating a group of training samples by retrieving a plurality of measurement data from the RF signals;
   (c) constructing a neural network according to the group of training samples;
   (d) calibrating RF power of the communication devices using the neural network;
   (e) generating calibration results of the RF power; and
   (f) generating a frequency spectrum of the RF power according to the calibration results of the RF power, and displaying the frequency spectrum on a display device.

8. The method according to claim 7, wherein the frequency spectrum is a curve diagram that represents a relationship between digital-to-analog converter (DAC) power and the RF power.

9. The method according to claim 7, wherein block (b) comprises:
   calculating a normalization value of each of the RF power by performing a normalization operation;
   selecting part of the normalization values as input values of the neural network, and obtaining all the normalization values as output values of the neural network; and
   generating the group of training samples according to the input values and the output values.

10. The method according to claim 9, wherein the normalization operation is a operation function that is denoted as $\overline{P}_i = (P_i - P_{min})/(P_{max} - P_{min})$ where "$\overline{P}_i$" is the normalization value of a RF power, "$P_i$" is a RF power value, "$P_{max}$" is a maximum value of the RF power, and "$P_{min}$" is a minimum value of the RF power.

11. The method according to claim 7, wherein block (c) comprises:
   generating a plurality of nerve cells of the neural network;
   calculating a weight value of each of the nerve cells according to the group of training samples; and
   constructing the neural network based upon the nerve cells with corresponding weight values.

12. The method according to claim 7, wherein block (d) comprises:
   inputting part of the measurement data from an input layer of the neural network;
   outputting target data from an output layer of the neural network after the part of measurement data are transmitted through a hidden layer of the neural network;
   calculating calibrated data by performing a reversed normalization operation on the target data; and
   generating the calibrated RF power according to the calibrated data.

13. A non-transitory medium having stored thereon instructions that, when executed by a processor of a computing device, cause the computing device to perform a method for calibrating radio frequency (RF) power of communication devices, the method comprising:
  (a) collecting a plurality of RF signals transmitted from a plurality of communication devices;
  (b) generating a group of training samples by retrieving a plurality of measurement data from the RF signals;
  (c) constructing a neural network according to the group of training samples;
  (d) calibrating RF power of the communication devices using the neural network;
  (e) generating calibration results of the RF power; and
  (f) generating a frequency spectrum of the RF power according to the calibration results of the RF power, and displaying the frequency spectrum on a display device.

14. The medium according to claim 13, wherein the frequency spectrum is a curve diagram that represents a relationship between digital-to-analog converter (DAC) power and the RF power.

15. The medium according to claim 13, wherein block (b) comprises:
  calculating a normalization value of each of the RF power by performing a normalization operation;
  selecting part of the normalization values as input values of the neural network, and obtaining all the normalization values as output values of the neural network; and
  generating the group of training samples according to the input values and the output values.

16. The medium according to claim 15, wherein the normalization operation is a operation function that is denoted as $\overline{P}_i = (P_i - P_{min})/(P_{max} - P_{min})$ where "$\overline{P}_i$" is the normalization value of a the RF power, "$P_i$" is a RF power value, "$P_{max}$" is a maximum value of the RF power, and "$P_{min}$" is a minimum value of the RF power.

17. The medium according to claim 13, wherein block (c) comprises:
  generating a plurality of nerve cells of the neural network;
  calculating a weight value of each of the nerve cells according to the group of training samples; and
  constructing the neural network based upon the nerve cells with corresponding weight values.

18. The medium according to claim 13, wherein block (d) comprises:
  inputting part of the measurement data from an input layer of the neural network;
  outputting target data from an output layer of the neural network after the part of measurement data are transmitted through a hidden layer of the neural network;
  calculating calibrated data by performing a reversed normalization operation on the target data; and
  generating the calibrated RF power according to the calibrated data.

* * * * *